(12) United States Patent
Takeuchi et al.

(10) Patent No.: US 6,475,629 B1
(45) Date of Patent: Nov. 5, 2002

(54) ADHESIVE FILM FORMED OF A SILOXANE-MODIFIED POLYAMIDEIMIDE RESIN COMPOSITION, ADHESIVE SHEET AND SEMICONDUCTOR DEVICE

(75) Inventors: Kazumasa Takeuchi, Yuki (JP); Tetsuya Saito, Shimodate (JP); Ken Nanaumi, Shimodate (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 09/773,705

(22) Filed: Feb. 2, 2001

Related U.S. Application Data

(62) Division of application No. 09/181,678, filed on Oct. 29, 1998, now Pat. No. 6,252,010.

(30) Foreign Application Priority Data

Oct. 29, 1997 (JP) .............................. 9-297200
Nov. 28, 1997 (JP) .............................. 9-327984
Feb. 24, 1998 (JP) .............................. 10-41433
Sep. 25, 1998 (JP) ............................. 10-271149

(51) Int. Cl.$^7$ .......................... B32B 15/08; B32B 3/10; C09J 174/08; C25D 5/56; C25D 3/48

(52) U.S. Cl. ...................... 428/450; 428/131; 428/138; 428/596; 428/447; 428/448; 428/451; 428/615; 428/618; 428/626; 428/674; 428/672; 156/150; 156/250; 156/278; 156/329; 216/13; 216/20; 216/35; 216/39; 438/107; 438/119; 438/127; 438/455; 438/761; 438/763; 438/780; 257/702; 257/787; 205/80; 205/164; 205/169; 205/170; 205/182; 205/223; 205/266

(58) Field of Search ................................ 428/447, 448, 428/451, 450, 596, 615, 618, 626, 672, 674, 131, 138; 205/80, 164, 169, 170, 182, 223, 266; 438/107, 119, 127, 455, 761, 763, 780; 257/702, 787; 156/150, 250, 278, 329; 216/13, 20, 35, 39

(56) References Cited

U.S. PATENT DOCUMENTS

| | | | |
|---|---|---|---|
| 3,338,859 A | | 8/1967 | Green |
| 3,392,144 A | | 7/1968 | Holub |
| 4,791,157 A | | 12/1988 | Nishizawa et al. |
| 5,932,351 A | | 8/1999 | Shinada et al. |
| 5,976,912 A | * | 11/1999 | Fukutomi et al. ........... 438/110 |
| 5,994,773 A | * | 11/1999 | Hirakawa .................... 257/668 |
| 6,121,553 A | * | 9/2000 | Shinada et al. ............. 174/255 |
| 6,248,613 B1 | * | 6/2001 | Matsuura et al. ........... 438/106 |

FOREIGN PATENT DOCUMENTS

| | | |
|---|---|---|
| EP | 0013767 A1 | 8/1980 |
| EP | 0839868 A1 | 5/1998 |

OTHER PUBLICATIONS

Patent Abstracts of Japan, Publication No. 05179220, Publication Date–Jul. 20, 1993.
Patent Abstracts of Japan, Publication No. 05117616, Publication Date–May 14, 1993.
Patent Abstracts of Japan, Publication No. 05032892, Publication Date–Feb. 9, 1993.
Machine Translation of JP 05–179220 A, Inoue et al., Jul. 1993, obtained from JPO web–site.*
Machine Translation of JP 05–117616 A, Inoue et al., May 1993, obtained from JPO web–site.*

* cited by examiner

*Primary Examiner*—Robert Dawson
*Assistant Examiner*—Jeffrey B. Robertson
(74) *Attorney, Agent, or Firm*—Antonelli, Terry, Stout, & Kraus, LLP

(57) ABSTRACT

Adhesive film useful for the production of semiconductor devices is produced from a siloxane-modified polyamide-imide resin composition, comprising 100 parts by weight of a siloxane-modified polyamideimide resin and 1 to 200 parts by weight of a thermosetting resin ingredient.

9 Claims, 3 Drawing Sheets

ADHESIVE FILM FORMED OF A SILOXANE-MODIFIED POLYAMIDEIMIDE RESIN COMPOSITION, ADHESIVE SHEET AND SEMICONDUCTOR DEVICE

This application is a Divisional application of application Ser. No. 09/181,678, filed Oct. 29, 1998 now U.S. Pat. No. 6,252,010.

BACKGROUND OF THE INVENTION (a) Field of the Invention

The present invention relates to a siloxane-modified polyamideimide resin composition, an adhesive film, an adhesive sheet, a CSP board and a semiconductor device produced by using the composition.

The present invention further relates to a siloxane-modified polyamideimide resin useful for the siloxane-modified polyamideimide resin composition, and to varnish containing the siloxane-modified polyamideimide resin.

(b) Description of the Related Art

Polyamideimide resins are mainly used for wire coating (heat-resistant enamel wire) because they are excellent in electrical properties, heat resistance, mechanical properties and abrasion resistance. However, the high boiling solvents that are usually used for the production of polyamideimide resins have hindered forming film or sheet of polyamideimide resins. For example, they need time-consuming drying at low temperatures of 150° C. or lower, and the resulting film or sheet still contains at least 10% by weight of residual volatile matters. Even by drying at high temperatures above 150° C., it is difficult to produce sheets of above 100 $\mu$m thick containing not more than 5% by weight of residual volatile matters. Further, when resin compositions comprising polyamideimide resins and thermosetting resin ingredients are dried at high temperatures to produce sheets, thermal cure proceeds excessively, to make the production of B-stage sheets difficult.

An application of polyamideimide resins is the production of interlaminar adhesive films for wiring boards, which are films or sheets formed by applying resin compositions comprising polyamideimide resins and thermosetting resin ingredients on appropriate substrates. The desirable content of residual volatile matters in such films and sheets is 5% by weight or less, preferably 1% by weight or less. In films and sheets containing much volatile matters, voids or bubbles may be produced during processing with heat, such as press, bonding with heat and pressure or lamination, or thermal after-cure, which deteriorate insulating properties. In addition, such films and sheets must preserve their flowability to adhere to the substrates of printed circuit boards or to fill the depressions of the thickness of the copper foil made in the circuits. Therefore, drying of coating must be carried out at low temperatures so as not to cause thermal cure. It is desirable to decrease the residual volatile matters in sheets of any thickness, for example thick sheets above 100 $\mu$m thick. It is also desirable that the films or sheets of the resin compositions strongly adhere to the substrates.

In LSI-packaging technology, CSP's (chip-size-packages) have been popularized, which permit reducing the mounting area of LSI to chip sizes. CSP's have short wiring length, and produce little inductance. Therefore, they can speed up and improve the performances of LSI's, and are advantageously applied in recent cellar telephones and video cameras, and further in the DRAM of personal computers.

There are various types of CSP's, including the wire-bonding type, the ceramics type, the through-hole type and the $\mu$BGA type. Wire-bonding-type CSP's are produced by connecting chips to polyimide wiring boards by wire bonding followed by sealing with resins. CSP's of this type have simple structures and can be produced by modification of the conventional BGA techniques, and are expected to be the main current of CSP's with up to 100 small pins.

For example, CSP boards for wire-bonding type are produced by initially making through-holes, such as solder ball holes, in polyimide substrates coated with adhesives which can adhere to copper foil on heating, followed by lamination of copper foil by pressing or the like, circuit forming and gold plating. As the adhesives for bonding polyimide substrates and copper foil, epoxy resins, polyamic acids and mixtures of polyamic acids and bismaleimides have been used, while polyamideimide resins have been used mainly as wire coating materials because of the excellent electrical properties, heat resistance, mechanical properties and abrasion resistance.

As CSP's have been downsized and the number of pins has increased, the circuit of CSP boards has become finer, requiring heat resistant adhesives which adhere to copper more strongly. Conventional epoxy resin adhesives have poor resistance against wire-bonding or solder reflow owing to lack of heat resistance. Polyamic acids and mixtures thereof with bismaleimides have excellent heat resistance, but need high curing temperatures of 300 to 400° C. and their adhesion to copper foil or molded resin is insufficient.

An object of the present invention is to provide a siloxane-modified polyamideimide resin composition, which can form films containing little residual volatile matters, has high adhesion strength, appropriate flowability and superior heat resistance, strongly adheres to polyimide base layer and copper foil, exhibits excellent resistance to PCT (pressure cooker test) and, therefore, is useful for the production of interlaminar adhesive film for wiring boards.

Another object of the present invention is to provide an adhesive film, an adhesive sheet, a CSP board and a semiconductor device, which are produced by using the siloxane-modified polyamideimide resin composition.

Another object of the present invention is to provide a siloxane-modified polyamideimide resin useful for the preparation of the siloxane-modified polyamideimide resin composition.

Another object of the present invention is to provide a varnish containing the siloxane-modified polyamideimide resin.

Polyamideimide resins are typically produced by the isocyanate method comprising the reaction of trimellitic anhydride with aromatic diisocyanates, or by the acid chloride method comprising the reaction of aromatic diamines with trimellitic chloride followed by reaction with aromatic diisocyanates. The kinds and properties of the polyamideimide resins obtainable by the diisocyanate method are limited owing to the scarcity of the kinds of commercially available industrial aromatic diusocyanates. On the other hand, the acid chloride method needs a purification process for removing the by-product HCl, and therefore is disadvantageously costly. Japanese Patent Application Unexamined Publication No. 3-181511 discloses the production of polyamideimide resins by a two-step method comprising the reaction of aromatic tricarboxylic anhydrides with excess diamines having ether bonds, followed by reaction with diisocyanates. Japanese Patent Application Unexamined Publication No. 4-182466 discloses the production of diimidodicarboxylic acids of high purity by the reaction of aromatic diamines with trimellitic anhydride. If combined with the reaction of the product diimidodicarboxylic acids with diisocyanates, this method may enable easy production of substantially by-product-free polyamideimide resins of high molecular weights from various kinds of diamines, since it does not produce the by-product HCl that is formed in the acid chloride method.

Polydimethylsiloxanes consist of highly ionic, cohesive main chains and nonionic and less cohesive side chains, and when there is no action except the interaction between polymers, they are known to have helical structure, with the siloxane bonds directed inward. It is also known that introducing siloxane structures into polymers enlarges the space occupied by polymer molecules due to the helical structure of the siloxane parts, thereby increasing the gas permeability of the polymers. Siloxane structures are also expected to improve resin properties including elasticity and flexibility because they are scarcely interactive each other in spite of their vigorous vibration with heat. If siloxane structures can be introduced into inherently heat resistant polyamideimide resins by the industrially advantageous isocyanate method, it will be possible to produce heat resistant polymers of various properties and improve the drying efficiency of polyamideimide resins, which are usually produced by using high boiling solvents. However, there have been proposed no method of producing high molecular weight polymers.

The method disclosed in Japanese Patent Application Unexamined Publication No. 3-181511, wherein aromatic tricarboxylic anhydrides are allowed to react with excess diamines having ether bonds followed by reaction with diisocyanates, needs dehydration agents because the first reaction stage requires not only the reaction of acid anhydrides with amino groups but also the reaction of carboxylic acid with amino groups. Therefore, oligomerization occurs even in the first reaction stage, and, in the second reaction stage, various competing reactions occur between oligomers of different molecular weights and diisocyanates, to form by-products. It is therefore impossible to produce polyamideimide resins having sufficiently high molecular weight. If the diimidodicarboxylic acids produced by the method disclosed in Japanese Patent Application Unexamined Publication No. 4-182466 are allowed to react with diisocyanates, polyamideimides of desired properties will be obtainable by using various commercial aromatic diamines, and the absence of the by-product HCl formed in the acid chloride method will facilitate the production procedure. However, as taught in Japanese Patent Application Unexamined Publication No. 4-182466, the diimidodicarboxylic acids produced from diamines having two or less aromatic rings are insoluble in the solvents used for synthesis, and must be filtered previous to succeeding reactions, causing a costly increase of filtration or purification steps. Another drawback is that the purified diimidodicarboxylic acids have low solubility, so that the molecular weights of the reaction products thereof with aromatic diisocyanates are too low to produce film from varnish thereof.

According to an improved method, high molecular weight polyamideimide resins are produced by allowing diamines having three or more aromatic rings with trimellitic anhydride in the coexistence of aprotic polar solvents and aromatic hydrocarbons azeotropic with water, to remove the by-product water by distillation, and then allowing the obtained aromatic diimidodicarboxylic acids with diisocyanates. However, when the diamines are partially replaced by siloxanediamines, this method could not produce siloxane-modified polyamideimide resins having sufficiently high molecular weights.

To solve the problem, we have studied to provide a method whereby high molecular weight siloxane-modified polyamideimide resins can be produced without filtration steps, and have completed the present invention.

SUMMARY OF THE INVENTION

The present invention provides a siloxane-modified polyamideimide resin composition, comprising 100 parts by weight of a siloxane-modified polyamideimide resin and 1 to 200 parts by weight of a thermosetting resin ingredient.

The present invention further provides an adhesive film which is made from the siloxane-modified polyamideimide resin composition of the present invention by applying a varnish of the siloxane-modified polyamideimide resin composition on a supporting substrate.

The present invention further provides an adhesive sheet comprising a polyimide base layer and an adhesive layer (a) disposed on at least one side of the polyimide base layer, the adhesive layer (a) being a layer of a B-stage cured product of the siloxane-modified polyamideimide resin composition of the present invention.

The present invention further provides a CSP board produced by a method comprising the steps of:

(1) making a through-hole, which is to be used as a solder ball hole, in the adhesive sheet of the present invention, (2) laminating a copper foil on the adhesive layer (a) of the adhesive sheet, (3) forming a circuit by removing unnecessary parts of the copper foil by etching, and (4) gold plating a surface of the circuit.

The present invention further provides a semiconductor device, comprising the CSP board of the present invention, a semiconductor chip bonded by an adhesive to the surface of the CSP board bearing the circuit, bonding wires connecting the circuit of the CSP board to bonding pads of the semiconductor chip, and a molded resin sealing the circuit of the CSP board, the bonding wires and the semiconductor chip.

The present invention further provides a siloxane-modified polyamideimide resin, which is produced by allowing a mixture (X) comprising a diamine (A) having three or more aromatic rings per molecule and a siloxanediamine (B) to react with trimellitic anhydride (C) to form a diumidodicarboxylic acid mixture (Y) comprising an aromatic diimidodicarboxylic acid derived from the diamine (A) and a siloxane diimidodicarboxylic acid derived from the siloxanediamine (B), and allowing the diimidodicarboxylic acid mixture (Y) to react with an aromatic diisocyanate (D).

The present invention further provides a varnish containing the siloxane-modified polyamideimide resin of the present invention.

DESCRIPTION OF THE PREFERRED EMBODIMENTS

Figure 1:
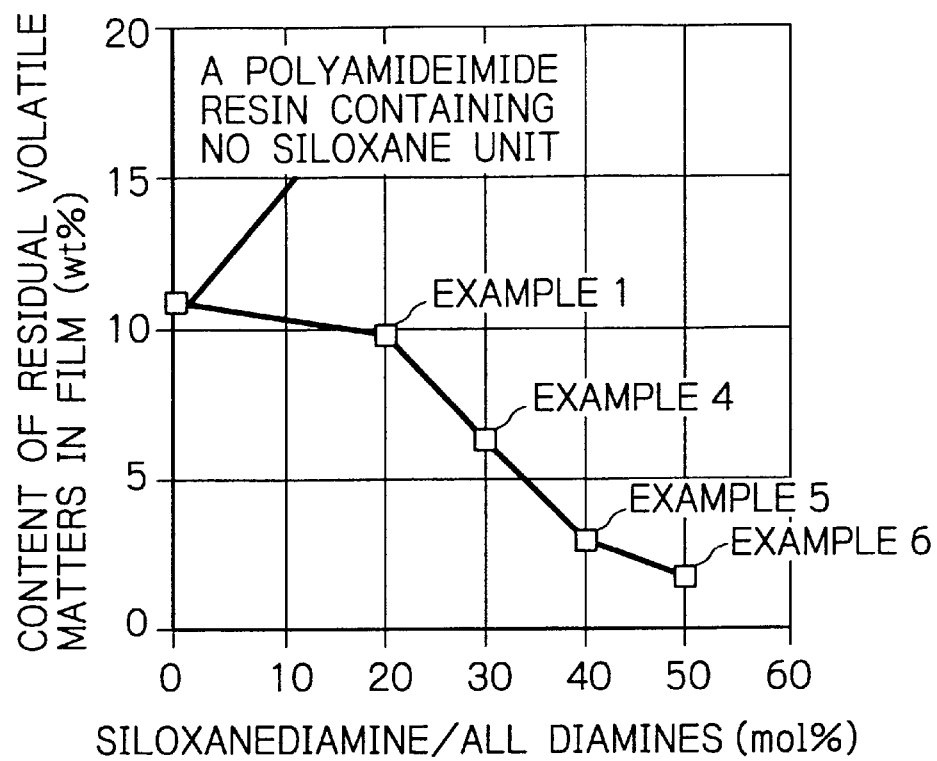
FIG. 1 is a graph showing the percentage of the siloxanediamine in all diamines used in each of Examples 1, 4, 5 and 6 and the amount of the solvents remaining in the siloxane-modified polyamideimide film of each Example.

The siloxane-modified polyamideimide resin composition (also referred to herein as "resin composition") comprises 100 parts by weight of a siloxane-modified polyamideimide resin and 1 to 200 parts by weight of a thermosetting resin-ingredient. It permits fast evaporation of varnish solvents and reduction of residual volatile matters to 5% by weight or less even in thick film, and can produce adhesive film exhibiting good adhesion to substrates.

A preferred example of the siloxane-modified polyamideimide resins useful for the resin composition of the present invention is the siloxane-modified polyamideimide resin of the present invention that is produced by allowing a mixture (X) comprising a diamine (A) having three or more aromatic rings per molecule and a siloxanediamine (B) to react with trimellitic anhydride (C) to form a diimidodicarboxylic acid mixture (Y) containing an aromatic diimidodicarboxylic acid derived from the diamine (A) and a siloxane diimidodicarboxylic acid derived from the siloxanediamine (B), and allowing the diimidodicarboxylic acid mixture (Y) to react with an aromatic diusocyanate (D).

The preferred among the siloxane-modified polyamideimide resins of the present invention are siloxane-modified polyamideimide resins which are produced by allowing a mixture (X) comprising a diamine (A) having three or more aromatic rings per molecule and a siloxane diamine (B) to react with trimellitic anhydride (C) to form a duimidodicarboxylic acid mixture (Y) containing an aromatic diimidodicarboxylic acid of the general formula (1) and a siloxane-diimidodicarboxylic acid of the general formula (2), and allowing the diimidodicarboxylic acid mixture (Y) to react with an aromatic diisocyanate (D) of the general formula (3):

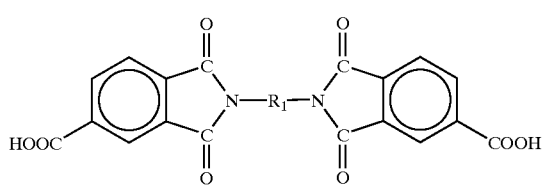

(1)

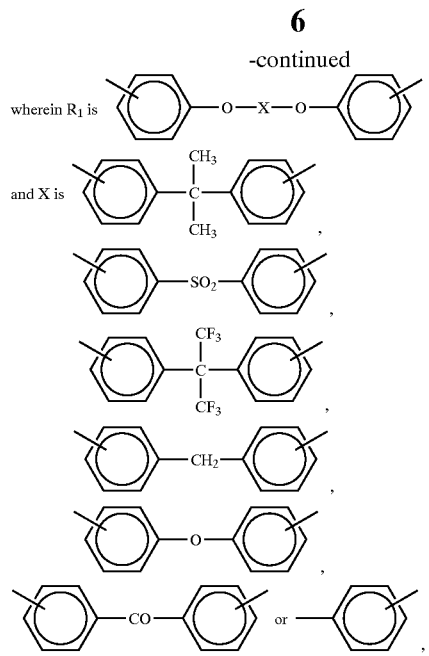

(2)

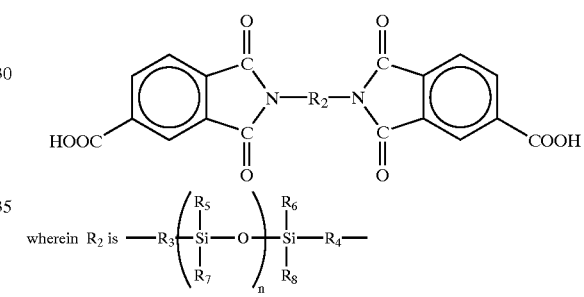

wherein $R_3$ and $R_4$ are each a divalent organic group, $R_5$ to $R_8$ are each an alkyl group, phenyl or a substituted phenyl, and n is an integer of 1 to 50,

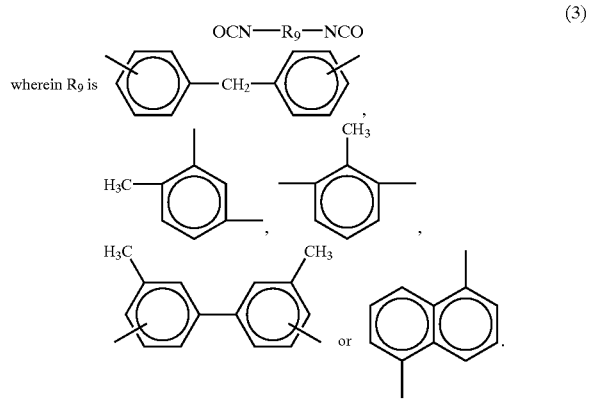

(3)

Allowing the mixture (X) comprising the diamines (A) having three of more aromatic rings (A) and the siloxanediamine (B) with trimellitic anhydride (C) improves the production efficiency because the resulting diimidodicarboxylic acid mixture (Y) also has good solubility and can react with the aromatic diisocyanate (D) in a solution state.

The more preferred among those are siloxane-modified polyamideimide resins which are produced by allowing the mixture (X) comprising the diamine (A) and the siloxane diamine (B) in a molar ratio (A)/(B) of 99.9/0.1 to 0.1/99.9 to react with trimellitic anhydride (C) in a molar ratio {(A)+(B)}/(C) of 1/2.05 to 1/2.20 to form the diimidodicarboxylic acid mixture (Y) containing the aromatic diimidodicarboxylic acid of the general formula (1) and the siloxanediimidodicarboxylic acid of the general formula (2), and allowing the diimidodicarboxylic acid mixture (Y) to react with the aromatic diisocyanate (D) of the general formula (3) in a molar ratio of {(A)+(B)}/(D) of 1/1.05 to 1/1.50.

By using the diamine (A), the siloxanediamine (B), trimellitic anhydride (C) and the aromatic diisocyanate (D) in the ratios described above, siloxane-modified polyamideimide resins of high molecular weights can be produced without catalysts or the like.

In the mixture (X), the molar ratio of the diamine (A) to the siloxanediamine (B) is preferably (A)/(B)=90/10–30/70, more preferably (A)/(B)=85/15–45/55. The molar ratio of {(A)+(B)}/(C) is preferably 1/2.07–1/2.15, more preferably 1/2.08–1/2.12. The molar ratio of {(A)+(B)}/(D) is preferably 1/1.10–1/1.50, more preferably 1/1.20–1/1.30.

An example of the diimidodicarboxylic acid mixture (Y) is a mixture (Y') containing 2,2-bis[4-{4-(5-hydroxycarbonyl-1,3-dione-isoindorino)phenoxy}phenyl]propane and bis(5-hydroxycarbonyl-1,3-dione-isoindorino)propyl-polydimethylsiloxane, which is produced by allowing a mixture (X') comprising 2,2-bis[4-(4-aminophenoxy)phenyl]propane as the diamine (A) and a diaminopolydimethylsiloxane as the siloxanediamine (B) to react with trimellitic anhydride (C). An example of the siloxane-modified polyamideimide resins of the present invention is produced by allowing the mixture (Y') with 4,4'-diphenylmethane diisocyanate as the aromatic diusocyanate (D).

The siloxane-modified polyamideimide resin of the present invention is preferably produced by allowing the mixture (X) comprising the diamine (A) having three or more aromatic rings per molecule and the siloxane diamine (B) in a molar ratio (A)/(B) of 99.9/0.1 to 0.1/99.9 to react with trimellitic anhydride (C) in a molar ratio {(A)+(B)}/(C) of 1/2.05 to 1/2.20 in the presence of an aprotic polar solvent at 50 to 90° C., then at 120 to 180° C. after addition of 10 to 50% by weight, based on the aprotic polar solvent, of an aromatic hydrocarbon which is azeotropic with water, to form the diimidodicarboxylic acid mixture (Y) containing the aromatic diimidodicarboxylic acid derived from the diamine (A) and the siloxanediimidodicarboxylic acid derived from the siloxanediamine (B), and allowing the diimidodicarboxylic acid mixture (Y) to react with the aromatic diisocyanate (D).

After the production of the diimidodicarboxylic acid mixture (Y), the aromatic hydrocarbon is preferably removed from the mixture (Y) by distillation or the like prior to the reaction of the mixture (Y) with the aromatic diisocyanate (D). The product siloxane-modified polyamideimide resin may be dissolved in aprotic polar solvents to use it as varnish for various applications.

Herein, examples of the divalent organic groups represented by $R_3$ and $R_4$ are alkylenes of 1 to 9 carbon atoms, arylenes of 6 to 10 carbon atoms and aralkylenes of 8 to 12 carbon atoms, including methylene, ethylene, propylenes, such as trimethylene, butylenes, such as tetramethylene and 2-methyl-1,3-propylene, methylphenylene, xylylene, methylxylylene and 2-phenyl-1,3-propylene. The particularly preferred among these is trimethylene because of the easy availability of the siloxanediamines.

Examples of the alkyls represented by $R_5$–$R_8$ include alkyls of 1 to 3 carbon atoms, and examples of the substituents on the substituted phenyls include alkyls of 1 to 3 carbon atoms, and the number of the substituents is preferably 1 to 3.

"n" is an integer of 1 to 50, preferably 8 to 25.

Examples of the diamines (A) having three or more aromatic rings, which are useful in the present invention, include those represented by the following general formula (4):

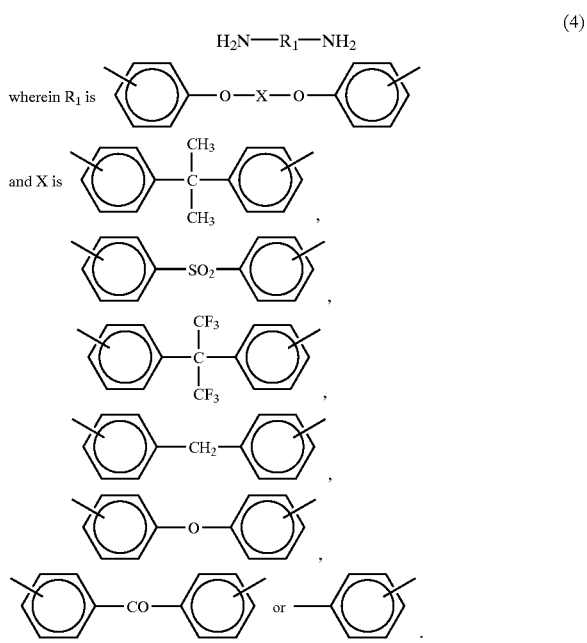

Typical examples of such aromatic diamines (A) include 2,2-bis[4-(4-aminophenoxy)phenyl]propane (abbreviated, herein, to "BAPP"), bis[4-(3-aminophenoxy)phenyl]sulfone, bis[4-(4-aminophenoxy)phenyl]sulfone, 2,2-bis[4-(4-aminophenoxy)phenyl]hexafluoropropane, bis[4-(4-aminophenoxy)phenyl]methane, 4,4'-bis(4-aminophenoxy)biphenyl, bis[4-(4-aminophenoxy)phenyl]ether, bis[4-(4-aminophenoxy)phenyl]ketone, 1,3-bis(4-aminophenoxy)benzene, and 1,4-bis(4-aminophenoxy)benzene. These aromatic diamines (A) may be used individually or in combination of two or more. BAPP is particularly preferable to produce polyamideimide resins having balanced properties with low cost.

Examples of the siloxanediamines (B) useful in the present invention include those represented by the following general formula (5):

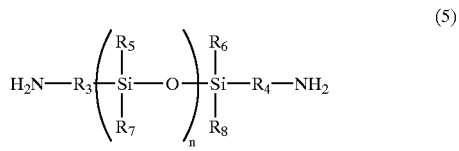

wherein $R_3$ and $R_4$ are each a divalent organic group, $R_5$ to $R_8$ are each an alkyl group, phenyl or a substituted phenyl, and n is an integer of 1 to 50.

Typical examples of such siloxanediamines are those represented by the following formulae (6), (7) and (8):

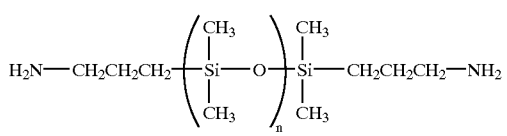

(6)

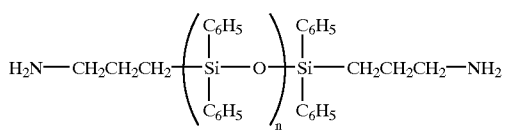

(7)

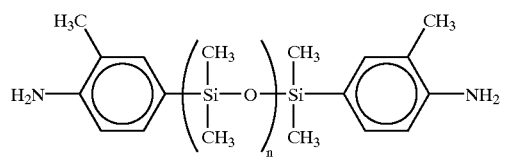

(8)

wherein n is an integer of 1 to 50.

The amine-endcapped dimethylsiloxanes of the formula (6) are marketed as amino-modified reactive silicone oils under the trade names of X-22-161AS (amine equivalent weight: 450), X-22-161A (amine equivalent weight: 840), X-22-161B (amine equivalent weight: 1500) (all produced by Sin-Etsu Chemical Co., Ltd.), BY16-853 (amine equivalent weight: 650), BY16-853B (amine equivalent weight: 2200) (all produced by Dow Corning Toray silicone Co., Ltd.).

The mixture (X) of the diamine (A) having three or more aromatic rings and the siloxanediamine (B) is allowed to react with trimellitic anhydride (C) (abbreviated, hereinafter, to "TMA"). The aprotic polar solvent and the aromatic hydrocarbon that is azeotropic with water must be non-reactive with the diamine (A), the siloxanediamine (B) and TMA (C), and the kinds and ratios of the aprotic polar solvent and the aromatic are of importance.

Examples of the aprotic polar solvents useful in the present invention include dimethylacetamide, dimethylformamide, dimethyl sulfoxide, N-methyl-2-pyrrolidone, 4-butyrolactone, sulfolane and cyclohexanone. Those boiling at 150 to 210° C., particularly N-methyl-2-pyrrolidone (abbreviated, hereinafter, to "NMP"), are desirable since imide preparations require high temperatures. The water content in the aprotic polar solvent is preferably kept to 0.2% by weight or less because hydration of TMA produces trimellitic acid, which interferes with the reaction and lowers the molecular weight of polymers. The amount of the aprotic polar solvent is preferably such that the diamine (A), the siloxanediamine (B) and trimellitic anhydride (C) make a total of 10 to 70% by weight, more preferably 15 to 35% by weight, based on the total of them with the aprotic polar solvent. A total of diamine (A), the siloxanediamine (B) and trimellitic anhydride (C) of less than 10% by weight is advantageous to industrial production. If (A), (B) and (C) make a total above 70% by weight, the solubilities of TMA (C) and the diimidodicarboxylic acid mixture (Y) will become insufficient to carry out satisfactory reaction.

Examples of aromatic hydrocarbons, which are azeotropic with water and useful in the present invention, include benzene, xylene, ethylbenzene and toluene, and toluene, boiling at a relatively low temperature and being less harmful to the working environment, is particularly desirable. The amount of the aromatic hydrocarbon is preferably 10 to 50% by weight, more preferably 10 to 30% by weight, particularly preferably 10 to 15% by weight based on the amount of the aprotic polar solvent. Azeotropic distillation with less than 10% by weight of aromatic hydrocarbon cannot remove water effectively enough to accelerate the production of diimidodicarboxylic acids. If the aromatic hydrocarbon is more than 50% by weight, the intermediate amidocarboxylic acids and the product diimidodicarboxylic acids may precipitate. In the course of the reaction, the aromatic hydrocarbon is distilled together with water by azeotrope and flows out of the reaction system. So the concentration of the aromatic hydrocarbon in solvent may decrease. To keep a uniform concentration of the aromatic hydrocarbon in the reaction system, it is desirable to feed back the effluent aromatic hydrocarbon to the reaction system after water is separated by using, for example, a water determination receptor equipped with a cock.

First the reaction of the diamine (A) and siloxanediamine (B) with trimellitic anhydride (C) is carried out in the presence of an aprotic polar solvent preferably at 50 to 90° C., more preferably 80 to 90° C. This reaction is continued until solid trimellitic anhydride disappears and the muddiness due to solids is cleared, for example for 20 to 60 minutes, preferably 30 to 60 minutes. After this reaction, an aromatic hydrocarbon azeotropic with water is added, and reaction is carried out at the azeotropic temperature. The reaction temperature depends on the amount of the aromatic hydrocarbon and the size of the water determination receptor used, and is generally 120 to 180° C., preferably 160 to 175° C. The reaction is continued until the formation of water in the reaction system ceases, preferably until the removal of the theoretical amount of water is confirmed.

The reaction solution containing the aromatic hydrocarbon may be used as such for the subsequent reaction, but is preferably freed of the aromatic hydrocarbon by distillation at higher temperatures so that the succeeding reaction with aromatic diisocyanate can be carried out at higher temperatures. The reaction of the resulting diimidodicarboxylic acid mixture (Y) containing the aromatic diimidodicarboxylic acid and the siloxanediimidodicarboxylic acid with the aromatic diisocyanate (D) can produce a high molecular weight aromatic polyamideimide resin.

Examples of the aromatic diisocyanates useful in the present invention include those of the general formula (3), typically 4,4'-diphenylmethane diisocyanate (abbreviated, hereinafter, to "MDI"), 2,4-tolylene diisocyanate, 2,6-tolylene diusocyanate, naphthalene-1,5-diisocyanate and 2,4-2,4-tolylene diisocyanate dimer, which may be used individually or in combination of two or more. MDI is particularly desirable because it contributes to low amido or imino concentrations in the molecular structure and to high solubility. The reaction is desirably carried out at 100 to 200° C., more preferably 150 to 170° C., to prevent prolonged reaction at lower temperatures and the reaction of the aromatic diusocyanate itself at higher temperatures. The reaction period is typically 1 to 3 hours, preferably 1.5 to 2 hours.

The siloxane-modified polyamideimide resin to be used in the resin composition of the present invention preferably has a weight average molecular weight (GPC, polystyrene conversion) of 40,000 to 150,000, more preferably 50,000 to 100,000.

Examples of the thermosetting resin ingredients useful in the resin composition of the present invention include epoxy resins, phenolic resins, polyester resins, unsaturated polyester resins, bismaleimide resins, polyurethane resins, polyimide resins and bismaleimidetriazine resins. The preferred among these are thermosetting resins having organic groups reactive with the amido groups of the siloxane-modified polyamideimide resin, and epoxy resins having glycidyls are particularly preferable because it contributes to strong adhesion and is easy to work with.

According to the present invention, the amount of the thermosetting resin ingredient is 1 to 200 parts by weight based on 100 parts by weight of the siloxane-modified polyamideimide resin. If it is less than 1 parts by weight, the resin composition will have insufficient solvent resistance, and if it is more than 200 parts by weight, unreacted thermosetting resin ingredient will cause a decrease of Tg, and make the resin composition inferior in heat resistance and flexibility. The preferred amount of the thermosetting resin ingredient is 3 to 150 parts by weight, more preferably 5 to 80 parts by weight based on 100 parts by weight of the siloxane-modified polyamideimide resin.

When used as the thermosetting resin ingredient, epoxy resins have another advantage that they can be cured at 180° C. or below and react with the amido groups of the siloxane-modified polyamideimide resin, thereby improving the thermal, mechanical and electrical properties. A preferred thermosetting resin ingredient is a combination of an epoxy resin having two or more glycidyls per molecule and a cure accelerator thereof, or a combination of an epoxy resin having two or more glycidyls and a curing agent thereof, or a combination of an epoxy resin having two or more glycidyls and a curing agent and a cure accelerator thereof. The more the glycidyls are, the better, preferably three or more per molecule. The necessary amount of epoxy resins depends on the amount of glycidyls, and the more the glycidyls are, the less the necessary amount is.

Typical epoxy resins are polyglycidyl ethers obtainable by the reactions of polyhydric phenols, such as bisphenol A, novolac phenolic resins or o-cresol novolac phenolic resins, or polyhydric alcohols, such as 1,4-butanediol, with epichlorohydrin; polyglycidyl esters obtainable by the reactions of polybasic acids, such as phthalic acid or hexahydrophthalic acid, with epichlorohydrin; N-glycidyl derivatives of amines, amides or compounds having heterocyclic nitrogen bases; and alicyclic epoxy resins.

The curing agents and cure accelerators for epoxy resins are not limited so far as they react with epoxy resins or accelerate curing reactions, and for example, amines, imidazoles, polyfunctional phenols and acid anhydrides may be used.

Examples of useful amines include dicyandiamide, diaminodiphenylmethane and guanylurea; examples of useful imidazoles include alkyl-substituted imidazoles and benzimidazole; examples of polyfunctional phenols include hydroquinone, resorcinol, bisphenol A, halides thereof and condensation products thereof with formaldehyde, namely novolac phenolic resins and resol phenolic resins; and examples of acid anhydrides include phthalic anhydride, benzophenone tetracarboxylic dianhydride and methylhymic acid.

The imidazoles exemplified above may be used as cure accelerators.

As to the amounts of such curing agents and cure accelerators, amines are preferably used in an amount which substantially equalizes the equivalents of the active hydrogen atoms of amines to the epoxy equivalents of epoxy resins, for example, 0.9–1.1 equivalents of the active hydrogen atoms per epoxy equivalent of epoxy resins are desirable. The amount of dicyandiamide cannot be defined directly as an equivalent ratio to active hydrogen atoms, and is, based on our experience, 0.001 to 10 parts by weight, preferably 0.1 to 10 parts by weight per 100 parts by weight of epoxy resins. The amounts of polyfunctional phenols and acid anhydrides are 0.6 to 1.2 equivalents per epoxy equivalent of epoxy resins.

If the amounts of curing agents and cure accelerators are too little, epoxy resins will partially remain uncured, to decrease Tg (glass transition temperature). If used in excess, they partially remain without undergoing reaction and may deteriorate insulating properties. Because epoxy groups of epoxy resins are also reactive to amino groups of the siloxane-modified polyamideimide resin, the proper epoxy equivalents is preferably calculated in consideration of such reaction.

For applications in wiring boards, the resin composition of the present invention may further contain electroless plating catalysts, which increase the adhesion between the walls of through-holes and plated metal and enable production of wiring boards by additive techniques.

The ratio of the siloxane-modified polyamideimide resin to the thermosetting resin ingredient in the resin composition may be defined based on the siloxane content in the siloxane-modified polyamideimide resin and on the epoxy equivalents of the epoxy resin in the thermosetting resin ingredient. The more the siloxane content, the faster the evaporation speed (drying speed) of the solvents contained in resin composition varnish. Even if mixed with a large amount of thermosetting resin ingredient such as an epoxy resin, siloxane-modified polyamideimide resin with a high siloxane content can produce a varnish having high drying speed, and therefore can produce under moderate drying conditions adhesive film or adhesive sheet containing little residual volatile matters.

The epoxy groups of epoxy resins are also reactive to the amido groups of the siloxane-modified polyamideimide resin. So in cases where epoxy resins are used as the thermosetting resin ingredient by themselves or in combination with cure accelerators and/or curing agents, the equivalent ratio of the epoxy groups of the epoxy resins to the amido groups of the siloxane-modified polyamideimide resin (equivalents of epoxy groups/equivalents of amide groups) is preferably 1 or less, more preferably 0.1–0.6, particularly preferably 0.1–0.4. If epoxy resins are used excessively, they will partially remain in film without undergoing cure reactions, thereby lowering the Tg of the film.

Adhesive film can be cured with heat. In cases where epoxy resins are used alone as the thermosetting resin ingredient, film is preferably cured at 180° C. or above, for example 180 to 250° C., more preferably 200 to 250° C., so that the glycidyl groups of epoxy resins undergo addition reaction with the amido groups of the siloxane-modified polyamideimide resin to produce three-dimensionally crosslinked resins. In cases where basic catalysts such as imidazoles are used as cure accelerators, curing can be performed at relatively low temperatures, for example at 160 to 190° C. In such cases, the glycidyl groups of epoxy resins and the amide groups of the siloxane-modified polyamide-imide resin undergo insertion reaction, to produce three-dimensionally crosslinked resins.

The adhesive film of the present invention may be produced by applying varnish of the resin composition of the present invention on a supporting substrate, followed by drying with heat to remove solvents. The varnish of the resin composition may be prepared by mixing the components of the resin composition in organic solvents. Any organic solvent which can dissolve all components is usable, and typical examples of such solvents include dimethylacetamide, dimethylformamide, dimethyl sulfoxide, N-methyl-2-pyrollidone, γ-butyrolactone, sulfolane and cyclohexanone.

Preferred examples of the supporting substrate are peelable plastic films, such as release-treated PET (polyethyleneterephthalate) film, polytetrafluoroethylene film and by-axially oriented polypropylene film. Metal foil, such as copper foil, may also be used as the supporting substrate, to produce metal foil-clad adhesive film.

In cases where metal foil is used as the supporting substrate, wiring circuits may be made from the metal foil. Further the metal foil may be etched away to produce self-standing film.

For example, varnish can be applied on supporting substrates by using comma coater, lip coater, blade coater, rod coater, knife coater, squeeze coater, reverse roll coater, transfer roll coater.

After coating, the varnish may be dried to various degrees depending on the use of the adhesive film. To produce adhesive film which is easy to work and shows good adhesion, adhesive film is preferably dried with heat to B-stage.

The thickness of the adhesive film is not limited, and is typically 5 to 30 µm.

The adhesive sheet of the present invention comprises a polyimide base layer and an adhesive layer (a) disposed on at least one side of the polyimide base layer, wherein the adhesive layer (a) is a layer of a B-stage cured product of the siloxane-modified polyamideimide resin composition. The adhesive sheet of the present invention is useful, for example, for production of wiring boards for semiconductor, particularly CSP boards. Varnish of the resin composition of the present invention permits fast evaporation of varnish solvent and reduction of residual solvent to 5% by weight or less even at low temperatures of 150° C. or below which do not promote curing of the thermosetting resin ingredient. The adhesive sheet therefore exhibits good adhesion of the adhesion layer (A) to the polyimide base layer and copper foil. This is because the modification of heat resistant polyamideimide resin with siloxane enables decreasing residual solvent, prevents the blistering during lamination of copper foil owing to the evaporation of solvent and improves solder heat resistance.

For example, the polyimide base layer may be polyimide film of 10 to 30 µm thick or polyimide sheet of 40 to 125 µm thick, and marketed one may be used as it is. To further increase adhesion to adhesives, the polyimide base layer is preferably subjected to appropriate surface treatments. Examples of suitable surface treatments include chemical roughening, mechanical grinding and plasma treatment. In capability of improving adhesion, plasma treatment is superior because it make fine roughening and as well ionizes the surfaces of the polyimide base layer.

The adhesive layer (a) of the B-stage cured product of the siloxane-modified polyamideimide resin composition can be formed on the polyimide base layer, for example, by laminating a film of the resin composition, or by applying varnish of the resin composition on the base layer. The application method is preferred because the requisite of the adhesive layer (a) is only its adhesion to both copper foil and the polyimide base layer, and thinner adhesive layer (a) applies lesser stress on the polyamide base layer. The thickness of the adhesive layer (a) is preferably 30 µm or less, more preferably 10 µm or less.

In production of the adhesive sheet, a surface for bonding copper foil must be formed by half-curing the resin composition of the present invention to B-stage under moderate conditions which inhibit excessive cure. The resin composition of the present invention containing a siloxane-modified polyamideimide resin, has the advantage that the varnish thereof has high drying speed and can be dried at low temperatures. The adhesive sheet of the present invention may have the B-stage cured adhesive layer (a) on one or each side of the polyimide base layer. It may also have the B-stage cured adhesive layer (a) on one side of the polyimide base layer and another heat resistant adhesive layer (b) cured to C-stage on the other side. It is preferable to form adhesive layers on both sides of the polyimide because adhesive sheet having an adhesive layer only on one side tends to warp and become difficult to work with. For example, the adhesive sheet preferably has the adhesive layer (a) on one side of the polyimide base layer, and another heat resistant adhesive layer (b) on the other side. The adhesive layer (b) is preferably a layer of a thermosetting adhesive such as a polyamideimide resin, a siloxane-modified polyamideimide resin or an epoxy resin adhesive, which is uncured or cured to B- or C-stage.

The CSP board of the present invention is produced by a method comprising the steps of:
(1) making a through-hole, which is to be used as a solder ball hole, in the adhesive sheet of the present invention,
(2) laminating a copper foil on the adhesive layer (a),
(3) forming a circuit by removing unnecessary parts of the copper foil by etching, and
(4) gold plating a surface of the circuit.

The through-hole can be made in the adhesive sheet with a drill, a punch or a laser. Examples of lasers include excimer lasers, YAG lasers and carbonic acid gas lasers, with carbonic acid gas lasers preferred because of their superiority in processing speed, processing quality and cost. Laser processing is preferably accomplished in a short time with a laser beam of high power pulse. It is therefore desirable for easy radiation control to use a laser which radiates a beam with a pulse-width of 1 to 40 µs, a pulse-frequency of 150 to 10,000 Hz and a pulse-repeat-number of 1 to 10, with an output power capable of making a hole with 2 to 5 pulses. Such output power corresponds to energy densities of 15 to 40 J/cm$^2$. The lamination of copper foil on the adhesive layer (a) on one side of the adhesive sheet is preferably carried out with a press at a press temperature of 130 to 250° C. at a pressing pressure of 1 to 50 kg/cm$^2$.

The copper foil is not limited in kind, and preferably has a surface which is roughened electrically or chemically to increase its adhesion to the adhesive sheet. For example, TSC copper foil having an electrically roughened surface and copper foil having a surface roughened chemically by so-called CZ treatment may be used.

After laminated, the copper foil is shaped into a circuit by etching unnecessary parts. This step can be carried out by using common photolithography.

Then the surface of the circuit (including the copper foil on the openings of through-holes) is plated with gold, to complete the production of the CSP board.

Figure 5:
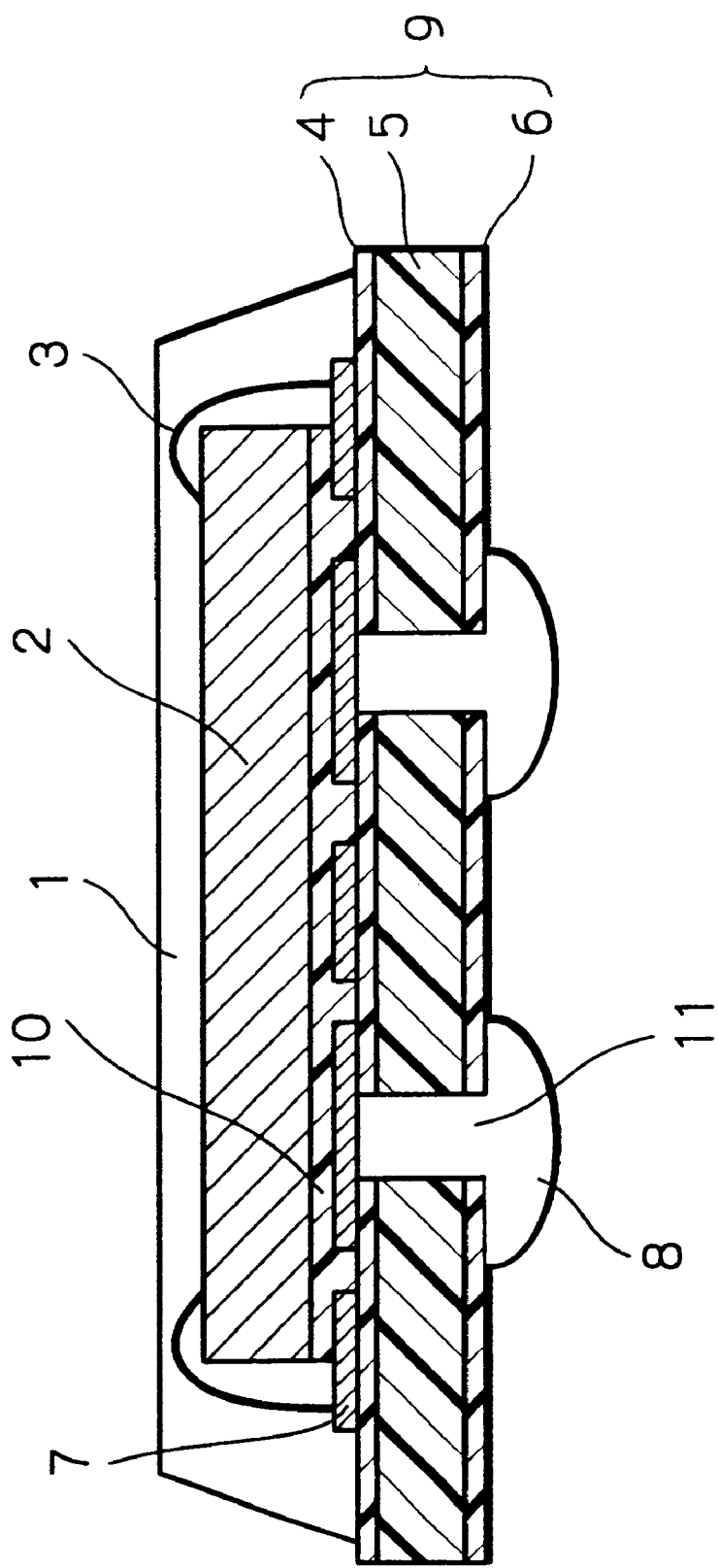
FIG. 5 is a cross-sectional view showing a semiconductor device of an embodiment according to the present invention.

FIG. 5 shows a cross-sectional view of a semiconductor device of an embodiment according to the present invention. The adhesive sheet 9 contained in the semiconductor device has, on one side of a polyimide base layer 5, an adhesive layer 4 which is a C-stage cured product of the siloxane-modified polyamideimide resin composition of the present invention (before lamination of copper foil, the adhesive layer 4 is a B-stage cured product of the siloxane-modified polyamideimide resin composition, and is cured to C-stage by the heat applied thereto during lamination of copper foil). The polyimide base layer 5 bears on the other side a heat resistant adhesive layer 6, which prevents the adhesive sheet 9 from warping and makes it easy to work with. A semiconductor chip 2 is bonded by an adhesive 10 to the surface of the CSP board bearing the circuit 7. The bonding pads of the semiconductor chip 2 are connected to the circuit 7 by bonding wires 3, and the circuit 7 of the CSP board, the bonding wires 3 and the semiconductor chip 2 are sealed with a molded resin 1. Solder balls 8 are fixed to the lower openings of the through-holes 11 to fill the through-holes 11.

EXAMPLE 1

In a 1-liter separable flask equipped with a 25 ml cock-equipped water determination receptor, a thermometer and a stirrer were placed 65.7 g (0.16 mol) of BAPP (2,2-bis[4-(4-aminophenoxy)phenyl]propane) as a diamine having three or more aromatic rings, 33.3 g (0.04 mol) of a reactive silicone oil X-22-161AS (trade name, produced by Shin-Etsu Chemical Co., Ltd., amine equivalent weight: 416) as a siloxanediamine, 80.7 g (0.42 mol) of TMA (trimellitic anhydride) and 560 g of NMP (N-methyl-2-pyrrolidone) as an aprotic polar solvent, and were stirred at 80° C. for 30 minutes. Subsequently, 100 ml of toluene as an aromatic hydrocarbon azeotropic with water was added, and the hydrocarbon azeotropic with water was added, and the temperature was then raised to carry out reflux at about 160° C. for 2 hours. After about 7.2 ml or more water was collected in the water determination receptor and the effusion of water ceased, the temperature was raised to about 190° C. while removing the effluent collected in the water determination receptor, to remove toluene. After the reaction solution was cooled to room temperature, 60.1 g (0.24 mol) of MDI (4,4'-diphenylmethane diisocyanate) was added as an aromatic diisocyanate, and reaction was then carried out at 190° C. for 2 hours. On completion of the reaction, an NMP solution of a siloxane-modified polyamideimide resin was obtained.

The solution varnish was applied on a glass plate and dried at 150° C. for 30 minutes to form a film, which was then peeled from the glass plate and heated at 180° C. for 1 hour, to give a film of about 60 μm thick made of the siloxane-modified polyamideimide resin. The glass transition temperature, the tensile strength, the elongation at break and the tensile modulus at room temperature of the film were measured. The molecular weight of the siloxane-modified polyamideimide resin was also determined, and the results are listed in Table 1. The glass transition temperature of the film was measured with a DVE (wide-temperature dynamic viscoelasticity measuring instrument, measuring frequency: 10 Hz) to define it as the temperature giving the maximum tan δ. The measurements of tensile strength, elongation at break and tensile modulus at room temperature were carried out with a tensile tester at a cross-head speed of 50 mm/min using a strip of 10 mm wide cut out from the film. The determination of molecular weight was carried out by GPC and conversion to standard polystyrene, using a mixture of 50 mg of the varnish with 5 ml of a solution of dimethylformamide/tetrahydrofuran=1/1 (volume ratio, phosphoric acid content: 0.06 M, lithium bromide content: 0.03 M).

EXAMPLE 2

In a 1-liter separable flask equipped with a 25 ml cock-equipped water determination receptor, a thermometer and a stirrer were placed 32.8 g (0.08 mol) of BAPP (2,2-bis[4-(4-aminophenoxy)phenyl]propane) as a diamine having three or more aromatic rings, 31.7 g (0.02 mol) of a reactive silicone oil X-22-161A (trade name, produced by Shin-Etsu Chemical Co., Ltd., amine equivalent weight: 792) as a siloxanediamine, 40.3 g (0.21 mol) of TMA (trimellitic anhydride) and 315 g of NMP (N-methyl-2-pyrollidone) as an aprotic polar solvent, and were stirred at 80° C. for 30 minutes. Subsequently, 100 ml of toluene as an aromatic hydrocarbon azeotropic with water was added, and the temperature was then raised to carry out reflux at about 160° C. for 2 hours. After about 3.6 ml or more water was collected in the water determination receptor and the effusion of water ceased, the temperature was raised to about 190° C. while removing the effluent collected in the water determination receptor, to remove toluene. After the reaction solution was cooled to room temperature, 30.0 g (0.12 mol) of MDI (4,4'-diphenylmethane diisocyanate) was added as an aromatic diisocyanate, and reaction was then carried out at 190° C. for 2 hours. On completion of the reaction, an NMP solution of a siloxane-modified polyamideimide resin was obtained. Film was formed from the solution, and the measurements of properties were carried out in the same manner as in Example 1. The results are listed in Table 1.

EXAMPLES 3 to 6

In a 1-liter separable flask equipped with a 25 ml cock-equipped water determination receptor, a thermometer and a stirrer were placed BAPP (2,2-bis[4-(4-aminophenoxy) phenyl]propane) as a diamine having three or more aromatic rings, a reactive silicone oil X-22-161AS (trade name, produced by Shin-Etsu Chemical Co., Ltd., amine equivalent weight: 416) as a siloxanediamine, TMA (trimellitic anhydride) and NMP (N-methyl-2-pyrollidone) as an aprotic polar solvent in the amounts as listed in Table 2, and were stirred at 80° C. for 30 minutes. Subsequently, 100 ml of toluene as an aromatic hydrocarbon azeotropic with water was added, and the temperature was then raised to carry out reflux at about 160° C. for 2 hours. After about 3.6 ml or more water was collected in the water determination receptor and the effusion of water ceased, the temperature was raised to about 190° C. while removing the effluent collected in the water determination receptor, to remove toluene. After the reaction solution was cooled to room temperature, MDI (4,4'-diphenylmethane diisocyanate) was added in the amounts as listed in Table 2 as an aromatic diisocyanate, and reaction was then carried out at 190° C. for 2 hours. On completion of the reaction, an NMP solution of a siloxane-modified polyamideimide resin was obtained. The molecular weights of the siloxane-modified polyamideimide resins were measured in the same manner as in Example 1. The results are listed in Table 2.

SILOXANE CONTENT AND THE CONTENT OF VOLATILE MATTERS IN FILM

Figure 2:
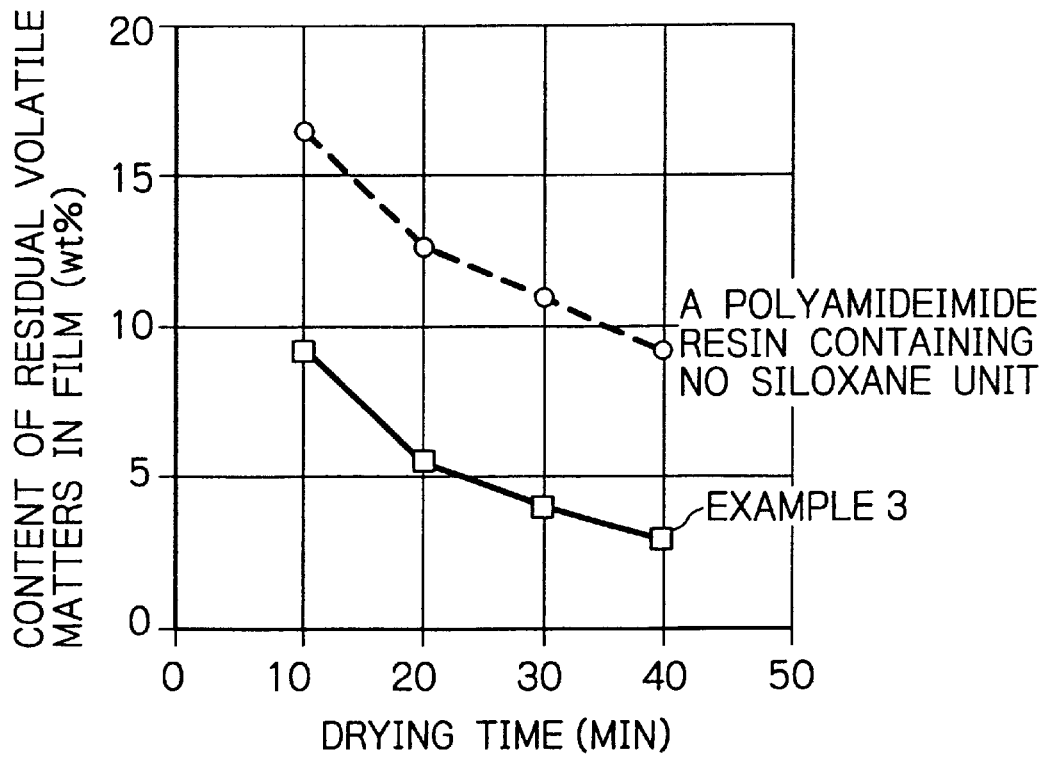
FIG. 2 is a graph showing the difference in drying speed between a polyamideimide resin containing no siloxane units and the siloxane-modified polyamideimide resin produced in Example 3.

The siloxane-modified polyamideimide resin solutions obtained in Examples 1, 4, 5 and 6 and a comparative solution of a polyamideimide resin produced without using siloxane diamines (trade name: KS-6000, produced by Hitachi Chemical Company, Ltd.) were applied on glass plates, dried at 150° C. for 30 minutes, and peeled from the glass plates, to give films of siloxane-modified polyamideimide resin and a film of a polyamideimide resin containing no siloxane units, all being about 60 μm thick. The films were cut to 50 mm square, weighed, heated to 180° C. for 1 hour, and weighed again, to determine the amounts of residual volatile matters in the films from the differences between the weights measured before and after the heating. The results are shown in FIG. 1. FIG. 1 shows that under the same drying conditions, volatile matters remaining in film decrease with an increase in the siloxanediamine units. Films were formed from the siloxane-modified polyamideimide resin solution obtained in Example 3 and the solution of the polyamideimide resin produced without using siloxane diamines, to determine the changes of the amounts of residual volatile matters remaining in the films with passage of time. The results are shown in FIG. 2, which shows that the resin containing siloxanediamine units had a higher drying speed.

EXAMPLES 7 to 9

In a 1-liter separable flask equipped with a 25 ml cock-equipped water determination receptor, a thermometer and a stirrer were placed BAPP (2,2-bis[4-(4-aminophenoxy) phenyl]propane) as a diamine having three or more aromatic rings, a reactive silicone oil X-22-161AS (trade name, produced by Shin-Etsu Chemical Co., Ltd., amine equivalent weight: 416) as a siloxanediamine, TMA (trimellitic anhydride) and NMP (N-methyl-2-pyrollidone) as an aprotic polar solvent in the amounts as listed in Table 3, and were stirred at 80° C. for 30 minutes. Subsequently, 100 ml of toluene as an aromatic hydrocarbon azeotropic with water was added, and the temperature was then raised to carry out reflux at about 160° C. for 2 hours. After about 3.6 ml or more water was collected in the water determination receptor and the effusion of water ceased, the temperature was raised to about 190° C. while removing the effluent collected in the water determination receptor, to remove toluene. After the reaction solution was cooled to room temperature, 25.0 g (0.1 mol) of MDI (4,4'-diphenylmethane diisocyanate) was added as an aromatic diisocyanate, and reaction was then carried out at 190° C. for 2 hours. On completion of the reaction, an NMP solution of a siloxane-modified polyamideimide resin was obtained.

Productions of films from the NMP solutions obtained in Examples 7 to 9 were tried to evaluate their properties, but the resulting films were fragile and could not be peeled from the glass plates. The determinations of molecular weights were carried out by GPC and conversion to standard polystyrene, using a mixture of 50 mg of each NMP solution with 5 ml of a solution of dimethylformamide/tetrahydrofuran=1/1 (volume ratio, phosphoric acid content: 0.06 M, lithium bromide content: 0.03 M). The results are listed in Table 3. All resins had relatively low molecular weights (Mw) ranging from 19000 to 35000.

TABLE 1

|  | Example 1 | Example 2 |
|---|---|---|
| Glass transition temperature (° C.) | 245 | 255 |
| Tensile strength (kg/mm$^2$) | 7.3 | 9.3 |
| Elongation at break (%) | 1.5 | 1.2 |
| Tensile modulus (MPa) | 1800 | 1600 |
| Molecular weight (weight average) | 69500 | 72000 |

TABLE 2

|  | BAPP (mol) | 161AS (mol) | TMA (mol) | NMP (g) | MDI (mol) | Mw |
|---|---|---|---|---|---|---|
| Example 3 | 0.08 | 0.02 | 0.22 | 290 | 0.13 | 63500 |
| Example 4 | 0.07 | 0.03 | 0.21 | 290 | 0.12 | 73000 |
| Example 5 | 0.06 | 0.04 | 0.21 | 300 | 0.12 | 59000 |
| Example 6 | 0.05 | 0.05 | 0.21 | 310 | 0.12 | 66000 |

TABLE 3

|  | BAPP (mol) | 161AS (mol) | TMA (mol) | NMP (g) | MDI (mol) | Mw |
|---|---|---|---|---|---|---|
| Example 7 | 0.08 | 0.02 | 0.20 | 250 | 0.1 | 35000 |
| Example 8 | 0.07 | 0.03 | 0.20 | 270 | 0.1 | 28000 |
| Example 9 | 0.05 | 0.05 | 0.20 | 290 | 0.1 | 19000 |

BAPP: 2,2-bis[4-(4-aminophenoxy)phenyl]propane
161AS: reactive silicone oil X-22-161AS (trade name, produced by Shin-Etsu Chemical Co., Ltd., amino equivalent weight: 416)
TMA: trimellitic anhydride
NMP: N-methyl-2-pyrollidone
MDI: 4,4'-diphenylmethane diisocyanate
Mw: weight average molecular weight As shown in Table 3, the siloxane-modified polyamideimide resins of Examples 7 to 9 were produced by allowing a diamine (A) having three of more aromatic rings and a siloxanediamine (B) to react with trimellitic anhydride (C) in a molar ratio {(A)+(B)}/(C) of 1/2.0 outside the preferred range of 1/2.05 to 1/2.20, and allowing the obtained diimidodicarboxylic acid mixture (Y) to react with an aromatic diisocyanate (MDI) in a molar ratio {(A)+(B)}/(D) of 1/1 outside the preferred range of 1/1.05 to 1/1.50. Their molecular weights were decreased by more than one-half compared with the siloxane-modified polyamideimide resins of Examples 3 to 6. To the contrary, the siloxane-modified polyamideimide resins produced by using a molar ratio {(A)+(B)}/(C) of 1/2.05 to 1/2.20 and a molar ratio {(A)+(B)}/(D) of 1/1.05 to 1/1.50 had high molecular weights. In spite of their low molecular weight, the siloxane-modified polyamideimide resins of Examples 7 to 9 are enough useful for the preparation of adhesives or coatings.

The siloxane-modified polyamideimide resin of the present invention is useful for the production of varnish, adhesive and adhesive film which require heat resistance, and therefore have wide applications in the industries of coatings, wiring boards, electrical instruments, automobiles, buildings, building materials and so on. Further, compared with conventional polyamideimide resins, it has wider applications because not only the siloxane-modified polyamideimide resin itself but also the intermediate products, siloxanediimidodicarboxylic acids and aromatic diimidodicarboxylic acids are soluble in solvents. Further, being soluble in solvents, it can be produced without filtration or purification and has an increased molecular weight, and, therefore, is a useful industrial material having good film formability and excellent resin properties. Also it can be advantageously used for the production of film or coating because its varnish can be dried readily, and the product film has little residual solvent content. Further, when used as an interlaminar-insulating adhesive, the film forms no voids on heating, thereby decreasing interlaminar insulation resistance and improving connection reliability.

SYNTHESIS EXAMPLES 1 TO 3

In a 1-liter separable flask equipped with a 25 ml cock-equipped water determination receptor, a thermometer and a stirrer were placed BAPP (2,2-bis[4-(4-aminophenoxy) phenyl]propane) as a diamine having three or more aromatic rings, a reactive silicone oil X-22-161AS (trade name, produced by Shin-Etsu Chemical Co., Ltd., amine equivalent weight: 416) as a siloxanediamine, TMA (trimellitic anhydride) and NMP (N-methyl-2-pyrollidone) as an aprotic polar solvent in the amounts as listed in Table 4, and were stirred at 80° C. for 30 minutes.

Subsequently, 100 ml of toluene as an aromatic hydrocarbon azeotropic with water was added, and the temperature was then raised to carry out reflux at about 160° C. for 2 hours. After about 7.2 ml or more water was collected in the water determination receptor and the effusion of water ceased, the temperature was raised to about 190° C. while removing the effluent collected in the water determination receptor, to remove toluene. After the reaction solution was cooled to room temperature, 60.1 g (0.24 mol) of MDI (4,4'-diphenylmethane diisocyanate) was added as an aromatic diisocyanate, and reaction was then carried out at 190° C. for 2 hours. On completion of the reaction, an NMP solution of a siloxane-modified polyamideimide resin was obtained.

TABLE 4

| | BAPP (g) | 161AS (g) | TMA (g) | NMP (g) | MDI (g) |
|---|---|---|---|---|---|
| Synthesis Example 1 | 65.7 (0.16 mol) | 33.3 (0.04 mol) | 80.6 (0.42 mol) | 444 | 60.1 (0.24 mol) |
| Synthesis Example 2 | 57.4 (0.14 mol) | 49.9 (0.06 mol) | 80.6 (0.42 mol) | 502 | 60.1 (0.24 mol) |
| Synthesis Example 3 | 41.0 (0.10 mol) | 83.2 (0.10 mol) | 80.6 (0.42 mol) | 618 | 60.1 (0.24 mol) |

BAPP: 2,2-bis[4-(4-aminophenoxy)phenyl]propane
161AS: reactive silicone oil X-22-161AS
TMA: trimellitic anhydride
NMP: N-methyl-2-pyrollidone
MDI: 4,4'-diphenylmethane diisocyanate

EXAMPLES 10 TO 19

Resin composition varnishes were prepared by mixing each of the siloxane-modified polyamideimide resins of Synthesis Examples 1 to 3 with an epoxy resin ESCN195 (trade name, produced by Sumitomo Chemical Industries, Co., Ltd.) in the ratios shown in Table 5, adding 0.6% by weight of 2-ethyl-4-methylimidazole based on the epoxy resin, stirring the mixtures for about 1 hour until uniform solutions were obtained, and then degassing by allowing them to stand at room temperature for 24 hours. Each resin composition varnish was applied on a supporting substrate (release treated PET film) and dried at 120° C. for 30 minutes to produce an adhesive film of 50 μm thick cured to B-stage. Each adhesive film was peeled off from the supporting substrate, fixed to a frame of polytetrafluoroethylene resin, and then further cured by heating at 180° C. for 60 minutes. The properties of the cured adhesive films were measured and listed in Table 5. The contents of residual volatile matters in the B-stage adhesive films were determined from the difference between the weights of each adhesive film measured before and after the heating. The results are also listed in Table 5.

COMPARATIVE EXAMPLE 1

A resin composition varnish was produced in the same manner as in Example 15 except that the siloxane-modified polyamideimide resin was replaced by a polyamideimide resin containing no siloxane units. It was formed in the same manner as in Examples 10 to 19 into a B-stage adhesive film, which had such a large content of residual volatile matters of 11.5% by weight.

Figure 3:
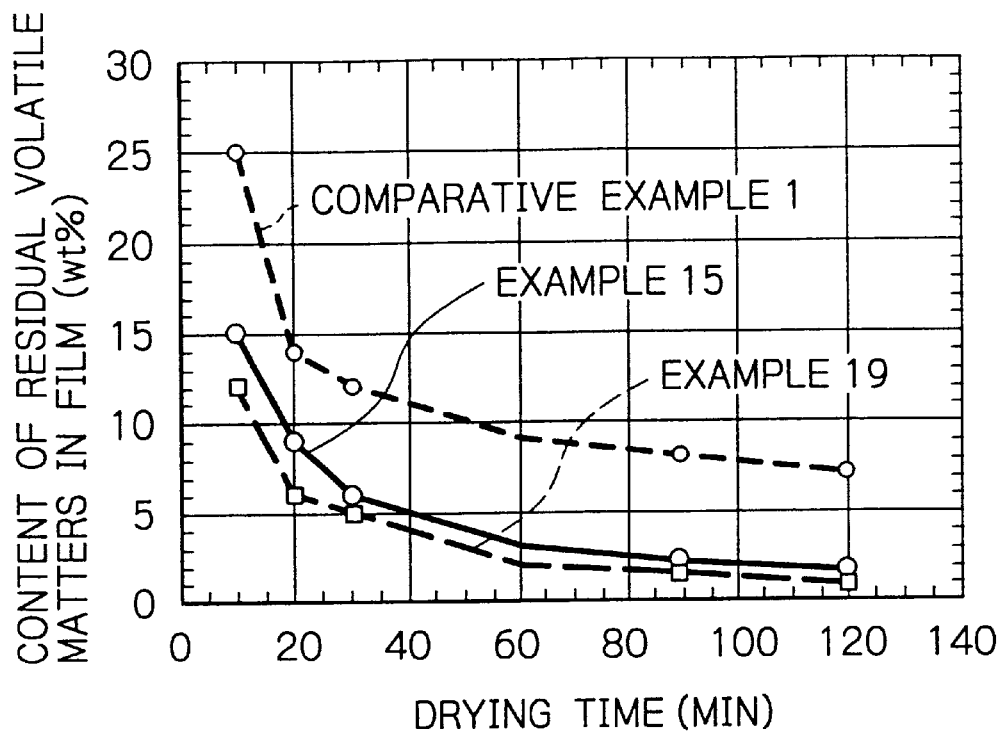
FIG. 3 is a graph showing the correlation in Examples 15 and 19 and Comparative Example 1 between the time of drying to produce film of 120 $\mu$m thick and the percentage of residual volatile matters.

The resin composition varnishes of Examples 15 and 19 and Comparative Example 1 were applied to substrates so that they would form dry films of 120 μm thick, then the contents of residual volatile matters were determined at varied drying times. The results are shown in FIG. 3. The decrease of the residual volatile matters in the varnish of Comparative Example 1 almost stopped at 8% by weight, while the residual volatile matters in the varnishes of Examples 15 and 19 decreased to 3% by weight or less.

COMPARATIVE EXAMPLE 2

A resin composition varnish was prepared by using the siloxane-modified polyamideimide resin of Synthesis Example 2 and ESCN-195 in a weight ratio of 60/40 (siloxane-modified-polyamideimide resin/ESCN-195).

Figure 4:
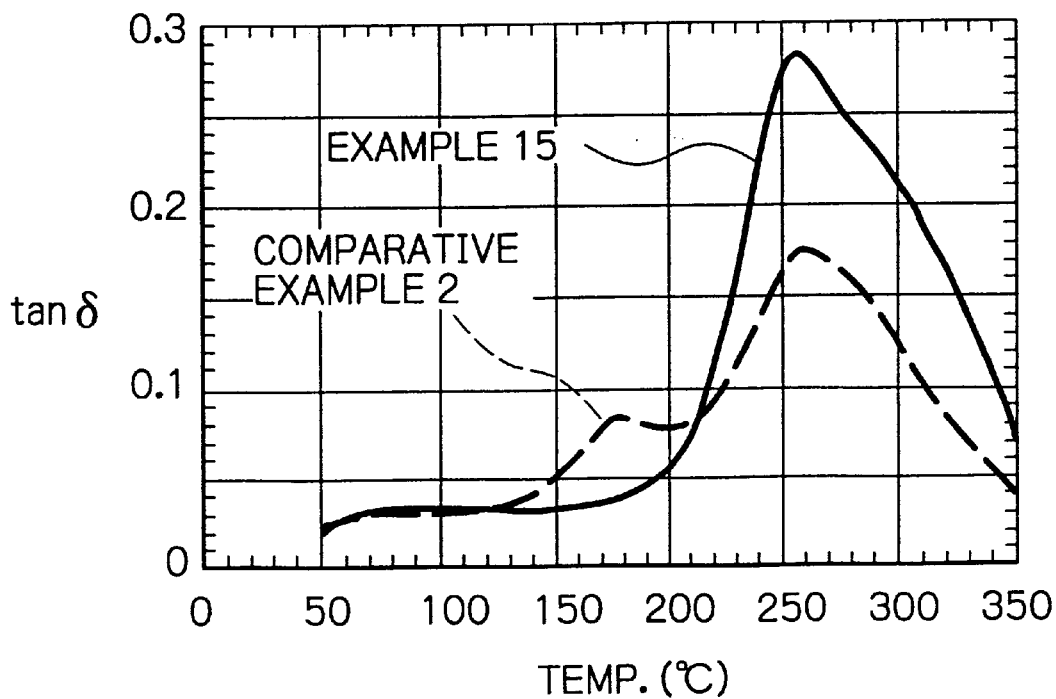
FIG. 4 is a graph showing the Tg of the cured films produced from the varnishes of Example 15 and Comparative Example 2.

The varnish of Example 15 and the varnish of Comparative Example 2 were formed into films, which were then cured by heating at 290° C. for 1 hour. The Tg's of the cured films were determined. The results are shown in FIG. 4. As shown in FIG. 4, the film produced from the varnish of Example 15 had a Tg of 260° C., while the film produced from the varnish of Comparative Example 2 exhibited a maximum tan δ at 170° C., which corresponds to the Tg of the epoxy resin which remained without reacting.

TABLE 5

| | Si-PAI | Resin compounding ratio (*1) | Content of residual volatile matters (%) | Tg (° C.) | Dynamic elastic modulus (GPa) | Adhesion strength to copper foil (kN/m) |
|---|---|---|---|---|---|---|
| Example 10 | Synthesis Ex. 1 | 90/10 | 2.1 | 220 | 1.7 | 2.2 |
| Example 11 | Synthesis Ex. 1 | 80/20 | 3.0 | 210 | 1.20 | 2.2 |
| Example 12 | Synthesis Ex. 1 | 70/30 | 4.9 | 200 | 0.81 | 2.0 |
| Example 13 | Synthesis Ex. 2 | 95/5 | 1.5 | 220 | 1.47 | 2.2 |
| Example 14 | Synthesis Ex. 2 | 90/10 | 1.8 | 215 | 1.81 | 2.2 |
| Example 15 | Synthesis Ex. 2 | 80/20 | 2.5 | 200 | 1.64 | 2.0 |
| Example 16 | Synthesis Ex. 2 | 70/30 | 4.3 | 200 | 0.62 | 1.7 |
| Example 17 | Synthesis Ex. 3 | 95/5 | 1.1 | 205 | 0.87 | 2.0 |

TABLE 5-continued

|  | Si-PAI | Resin compounding ratio (*1) | Content of residual volatile matters (%) | Tg (° C.) | Dynamic elastic modulus (GPa) | Adhesion strength to copper foil (kN/m) |
|---|---|---|---|---|---|---|
| Example 18 | Synthesis Ex. 3 | 90/10 | 1.5 | 200 | 0.75 | 1.9 |
| Example 19 | Synthesis Ex. 3 | 80/20 | 2.1 | 195 | 0.47 | 1.8 |

Si-PAI: Siloxane-modified polyamideimide resins produced in Synthesis Examples 1 to 3
Resin compounding ratio (*1): siloxane-modified polyamideimide resin/epoxy resin In Table 5, the properties of resin compositions were measured as follows.

(1) Glass Transition Temperature (Tg) and Dynamic Elastic Modulus

The measurements of these properties were carried by using a dynamic viscoelasticity measuring instrument: DVE-V4 (trade name, produced by Rheology Co., Ltd.) under the following conditions.

Jig: tension

The distance between chucks: 20 mm

Measuring temperature: 50 to 350° C.

Heating rate: 5° C./min

Measuring frequency: 10 Hz

Sample sizes: 5 mm wide×30 mm long

Tg: the temperature giving the maximum tan δ

(2) Adhesion Strength to Copper Foil

Varnish was applied on the mat surface of a roughened electrolytic copper foil TSA-35 (trade name, produced by Furukawa Circuit Foil Co., Ltd.), dried at 150° C. for 30 minutes, and then heated to 180° C. for 1 hour, to form a sample. The resin surface of the sample was ground with sandpaper #600 and bonded to a resin plate with an epoxy adhesive (ARALDITE-STANDARD). Then measurement of copper foil adhesion strength was carried out in accordance with JIS C 6481 by peeling the copper foil in 10 mm wide from the layer of the dried varnish.

As described above, the resin composition of the present invention allows high speed drying of solvent, and can produce, under moderate conditions, B-stage adhesive film with little content of residual volatile matters. When cured further, the adhesive film has a high Tg of 190° C. or above and exhibits a high adhesion strength to copper foil.

SYNTHESIS OF SILXOANE-MODIFIED POLYAMIDEIMIDE RESINS

SYNTHESIS EXAMPLE 4

An NMP solution of a siloxane-modified polyamideimide resin was produced in the same manner as in Example 1.

SYNTHESIS EXAMPLE 5

In a 1-liter separable flask equipped with a 25 ml cock-equipped water determination receptor, a thermometer and a stirrer were placed 41.1 g (0.10 mol) of BAPP (2,2-bis[4-(4-aminophenoxy)phenyl]propane) as a diamine having three or more aromatic rings, 41.6 g (0.10 mol) of a reactive silicone oil X-22-161AS (trade name, produced by Shin-Etsu Chemical Co., Ltd., amine equivalent weight: 416) as a siloxanediamine, 80.7 g (0.42 mol) of TMA (trimellitic anhydride) and 560 g of NMP (N-methyl-2-pyrollidone) as an aprotic polar solvent, and were stirred at 80° C. for 30 minutes. Subsequently, 100 ml of toluene as an aromatic hydrocarbon azeotropic with water was added, and the temperature was then raised to carry out reflux at about 160° C. for 2 hours. After about 7.2 ml or more water was collected in the water determination receptor and the effusion of water ceased, the temperature was raised to about 190° C. while removing the effluent collected in the water determination receptor, to remove toluene. After the reaction solution was cooled to room temperature, 60.1 g (0.24 mol) of MDI (4,4'-diphenylmethane diisocyanate) was added as an aromatic diisocyanate, and reaction was then carried out at 190° C. for 2 hours. On completion of the reaction, an NMP solution of a siloxane-modified polyamideimide resin was obtained.

PREPARATION OF RESIN COMPOSITION VARNISHES FOR PRODUCTION OF CSP BOARDS

PREPARATION EXAMPLE 1

A resin composition varnish was prepared by mixing 1416 g (resin content: 30% by weight) of the NMP solution of the siloxane-modified polyamideimide resin produced in Synthesis Example 5, 150 g (dimethylacetamide solution with resin content of 50% by weight) of an epoxy resin ESCN195 (trade name, a cresol novolac epoxy resin produced by Sumitomo Chemical Industries, Co., Ltd.) and 1.0 g of 2-ethyl-4-methylimidazole, stirring the mixture for about 1 hour until a uniform solution was obtained, and then degassing by allowing it to stand at room temperature for 24 hours.

PREPARATION EXAMPLE 2

A resin composition varnish was prepared by mixing 1680 g (resin content: 30% by weight) of the NMP solution of the siloxane-modified polyamideimide resin produced in Synthesis Example 4, 50 g (dimethylacetamide solution with resin content of 50% by weight) of an epoxy resin ESCN195 (trade name, a cresol novolac epoxy resin produced by Sumitomo Chemical Industries, Co., Ltd.) and 0.7 g of 2-ethyl-4-methylimidazole, stirring the mixture for about 1 hour until a uniform solution was obtained, and then degassing by allowing it to stand at room temperature for 24 hours.

PRODUCTION OF ADHESIVE SHEETS

PRODUCTION EXAMPLE 1

A polyimide film (trade name: UPILEX S, produced by Ube Industries, Ltd., thickness: 75 μm) as a polyimide base layer was subjected to plasma treatment, coated with the NMP solution of siloxane-modified polyamideimide resin produced in Synthesis Example 4 so that the coating would form a 10 μm thick layer after drying, passed through drying furnaces of 130° C./150° C./180° C. to dry the coating, and then wound up. The resin composition varnish of Preparation Example 1 was applied on the other side of the film so that the coating would form a 10 μm thick layer after drying. The film was then passed through drying furnaces of 120° C./120° C./120° C. to dry the coating to B-stage, and then wound up. The obtained adhesive sheet had the structure as shown in FIG. 5, wherein the adhesive sheet 9 is composed of a polyimide base layer 5, an adhesive layer 4 of a B-stage cured product of a siloxane-modified polyamideimide resin composition disposed on one side of the polyimide base layer 5, and an adhesive layer 6 of a siloxane-modified polyamideimide resin disposed on the other side.

PRODUCTION EXAMPLE 2

A polyimide film (trade name: UPILEX S, produced by Ube Industries, Ltd., thickness: 50 μm) as a polyimide base layer was subjected to plasma treatment, coated with the resin composition varnish produced in Preparation Example 2 so that the coating would form a 10 μm thick layer after drying, passed through drying furnaces of 130° C./150° C./180° C. to dry the coating, and then wound up. The resin composition varnish of Preparation Example 1 was applied on the other side of the film so that the coating would form a 10 μm thick layer after drying. The film was then passed through drying furnaces of 120° C./120° C./120° C. to dry the coating to B-stage, and then wound up. The obtained adhesive sheet had the structure as shown in FIG. 5, wherein the adhesive sheet 9 is composed of a polyimide base layer 5, an adhesive layer 4 of a B-stage cured product of a siloxane-modified polyamideimide resin composition disposed on one side of the polyimide base layer 5, and an adhesive layer 6 of a C-stage cured siloxane-modified polyamideimide resin composition disposed on the other side.

PRODUCTIONS OF CSP BOARDS AND SEMICONDUCTOR DEVICES

The adhesive sheets produced in Production Examples 1 and 2 were used to produce CSP boards and semiconductor devices which had the structures as shown in FIG. 5, except that wire bonding and soldering with solder balls were not carried out.

FORMATION OF THROUGH-HOLES

Each adhesive sheet 9 was drilled to make through-holes 11 of 300 μm in diameter in their predetermined positions.

LAMINATION PRESSING

A copper foil (trade name: SLP-18, thickness: 18 μm, produced by Nippon Denkai Co., Ltd.) was superposed on the adhesive layer 4 of the drilled adhesive sheet 9, and then pressed at 180° C. for 1 hour with a pressure of 20 kg/cm² applied thereto.

CIRCUIT PRODUCTION

The copper foil was patterned (line/space=30 μm /30 μm) by a conventional photolithography (application of a protection film on the adhesive layer 6 to prevent etchant from penetrating into through-holes 11, application of a photosensitive film on the adhesive layer 4, exposure through a patterned mask, development, etching and peeling of the photosensitive film and the protection film).

GOLD PLATING

Each circuit-processed board obtained above was degreased by alkali degreasing and acid degreasing. The surface of the copper circuit 7 was then subjected to soft etching using ammonium persulfate and sulfuric acid. The surface of the circuit 7 was plated with gold by carrying out acid cleaning (sulfuric acid: 10 vol %, room temperature, 1 minute), water cleaning (room temperature, 1 minute), replacement palladium plating (SA-100, trade name, produced by Hitachi Chemical Co., Ltd., plate thickness: 0.1 μm, 70° C., 5 minutes), water cleaning (room temperature, 1 minute), electroless nickel plating (NIPS-100, trade name, produced by Hitachi Chemical Company, Ltd., plate thickness: 5 μm, 85° C., 30 minutes), water cleaning (room temperature, 2 minutes), replacement gold plating (HGS-500, trade name, produced by Hitachi Chemical Co., Ltd., plate thickness: 0.02 μm, 85° C., 10 minutes), water cleaning (room temperature, 2 minutes), electroless gold plating (HGS-2000, trade name, produced by Hitachi Chemical Co., Ltd., plate thickness: 0.5 μm, 65° C., 60 minutes), water cleaning (room temperature, 5 minutes), and drying (80° C., 30 minutes), to produce a CSP board. A semiconductor chip 2 was bonded to the CSP board with an adhesive 10, and sealing was carried out by a conventional method, to produce a semiconductor device sealed with a molded resin 1 as shown in FIG. 5.

EVALUATION

The adhesion strengths (peeling strengths) between the copper circuit 7 and the adhesive layer 4 of the obtained CSP boards were measured. Either CSP board produced by using the adhesive sheets of Production Examples 1 or 2 exhibited an adhesion strength of 1.5 kN/m.

When the CSP boards were tested for soldering resistance by immersing them in solder bathes which was heated to 260° C., 288° C. and 300° C., respectively, no abnormality, such as blister or delamination, was recognized for 5 minutes or more at any temperature.

The through-holes had good appearance and were free of residue and exudation of adhesives.

When chips were bonded to the CSP boards and wire bonding was carried out under the following conditions, both CSP boards made good bonding. Wire bonding conditions:

output duration of ultrasonic waves: 20 ms, power of ultrasonic waves: 0.3 W, bonding load: 50 gf, temperature: 220° C.

The evaluation of wire bonding was carried out by measuring the pull strength. CSP boards that required a pull strength of 7 g or more were rated "good"; those that required a pull strength of less than 7 g or could not make bonding were rated "poor".

When the CSP boards were molded as shown in FIG. 5, the adhesion strength between the molded resin and the adhesive layers 4 of the CSP boards were 1.2 kN/m. After drying (180° C., 60 min), the adhesive layers 4 of the adhesive sheets produced in Production Examples 1 and 2 contained 3 wt % of residual solvents.

The cured products of the resin compositions of Preparation Examples 1 and 2 had a Tg (glass transition temperature) of 200° C., and exhibited a dynamic elastic modulus of 1.0 GPa at room temperature to 180° C. The measurement of dynamic elastic modulus was carried out with a dynamic viscoelasticity measuring instrument, RHEOSPECTRA DVE-4 (trade name) produced by Rheology Co., Ltd. by tensile mode, using a frequency of 10 Hz, at a heating rate of 5° C./min.

When subjected to water absorption reflow test using an IR reflow furnace according to the level 2 defined by JEDEC (Joint Electron Device Engineering Council)(after water absorption at 85° C., 60% humidity, for 168 hours), the semiconductor devices that were produced by using the CSP boards showed no abnormality, such as blister or delamination, at 230° C. for 5 seconds, showing excellent moisture heat resistance.

COMPARATIVE EXAMPLE 3

For comparison, an NMP solution of a polyamideimide resin was prepared in the same manner as in Synthesis Example 4, except that 0.20 mol of BAPP was used alone as diamine, and a resin composition varnish was produced in the same manner as in Preparation Example 1 by using the NMP solution. The resin composition varnish was applied on one side of a polyimide film (UPILEX S, trade name, produced by Ube Industries, Ltd., thickness: 75 µm) so that an adhesive layer of 10 µm thick would be formed after drying, and the coated film was passed through drying furnaces of 120° C./130° C./140° C. A copper foil (SLP-18, trade name, produced by Nippon Denkai Co., Ltd., thickness: 18 µm) was superposed on the adhesive layer, and then pressed at 180° C. for 1 hour at a pressure of 20 kg/cm². The adhesion strength between the copper foil and the adhesive layer was 0.9 kN/m, and after drying at 180° C. for 60 minutes, the adhesive layer contained 10 wt % of residual solvents. When the adhesive sheet bearing copper foil was immersed in a solder bath of 260° C., blister appeared on the copper foil in 10 to 20 seconds.

In the same manner, the NMP solution of siloxane-modified polyamideimide resin produced in Synthesis Example 5 was applied on one side of the same polyimide so that an adhesive layer of 10 µm thick would be formed after drying, and the coated film was passed through drying furnaces of 120° C./130° C./130° C. A copper foil (SLP-18, trade name, produced by Nippon Denkai Co., Ltd., thickness: 18 µm) was superposed on the adhesive layer, and then pressed at 180° C. for 1 hour with a pressure of 20 kg/cm². The adhesion strength between the copper foil and the adhesive layer was 0.2 kN/m, and after drying at 180° C. for 60 minutes, the adhesive layer contained 1 wt % of residual solvents. When the adhesive sheet bearing copper foil was immersed in a solder bath of 260° C., blistering and delamination occurred on the copper foil after one minute.

Because of their good heat resistance and excellent adhesion to copper circuit, the adhesive sheet and the CSP board of the present invention are useful for the production of semiconductor devices requiring fine wiring. The semiconductor device of the present invention produced by using the CSP board of the present invention exhibits good resistance to moisture absorption reflow, strong adhesion to molding resins and copper circuit, and is therefore applicable for uses requiring semiconductor devices with fine wiring.

What is claimed is:

1. An adhesive sheet comprising a polyimide base layer and an adhesive layer (a) disposed on at least one side of the polyimide base layer, the adhesive layer (a) being a layer of a B-stage cured product of a siloxane-modified polyamideimide resin composition comprising 100 parts by weight of a siloxane-modified polyamideimide resin having a weight average molecular weight of 40,000 to 150,000, and 1 to 200 parts by weight of a thermosetting resin ingredient.

2. The adhesive sheet of claim 1, which comprises the polyimide base layer, the adhesive layer (a) disposed on one side of the polyimide base layer and an adhesive layer (b) disposed on the other side of the polyimide base layer.

3. The adhesive sheet of claim 2, wherein the adhesive layer (b) is a layer of a siloxane-modified polyamideimide resin.

4. A chip-size package board produced by a method comprising the steps of:

(1) making a through-hole in the adhesive sheet of claim 1, then (2) laminating a copper foil on the adhesive layer (a), then (3) forming a circuit by removing unnecessary parts of the copper foil by etching, and then (4) gold plating a surface of the circuit.

5. A semiconductor device, comprising:

the chip-size package board of claim 4, a semiconductor chip bonded by an adhesive to the surface of the chip-size package board bearing the circuit, bonding wires connecting the circuit of the chip-size package board to bonding pads of the semiconductor chip, and a molded resin sealing the circuit of the chip-size package board, the bonding wires and the semiconductor chip.

6. The adhesive sheet of claim 1 wherein the siloxane-modified polyamideimide resin is a resin produced by allowing a mixture (X) comprising a diamine (A) having three or more aromatic rings per molecule and a siloxanediamine (B) in a molar ratio (A)/(B) of 99.9/0.1 to 0.1/99.9 to react with trimellitic anhydride (C) in a molar ratio {(A)+(B)}/(C) of 1/2.05 to 1/2.20 to form a diimidodicarboxylic acid mixture (Y) containing an aromatic dilmidodicarboxylic acid of general formula (1) and a siloxanediimidodicarboxylic acid of general formula (2), and allowing the diimidodicarboxylic acid mixture (Y) to react with an aromatic diisocyanate (D) of general formula (3) in a molar ratio of {(A)+(B)}/(D) of 1/1.05 to 1/1.50:,

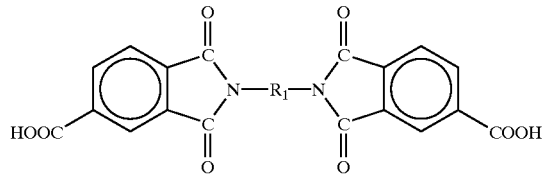

(1)

wherein $R_1$ is

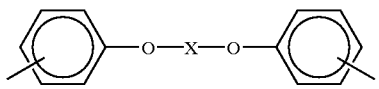

and X is

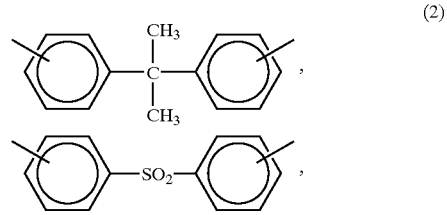

(2)

-continued

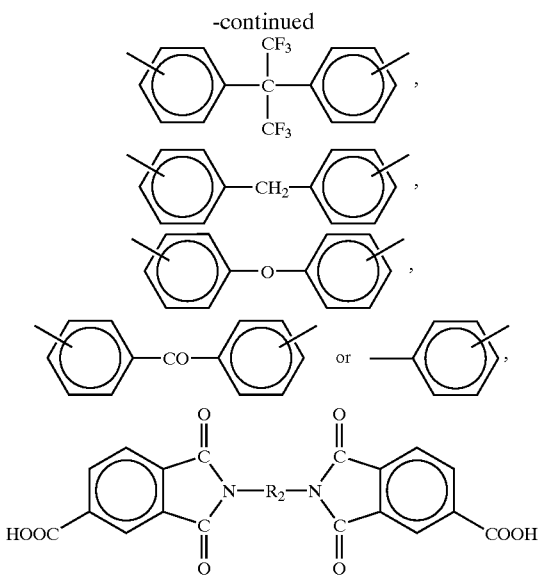

wherein $R_2$ is

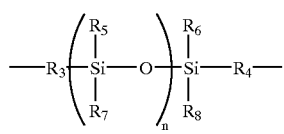

wherein $R_3$ and $R_4$ are each a divalent organic group, $R_5$ to $R_8$ are each an alkyl group, phenyl or a substituted phenyl, and n is an integer of 1 to 50, $$OCN-R_9-NCO \qquad (3)$$

wherein $R_9$ is

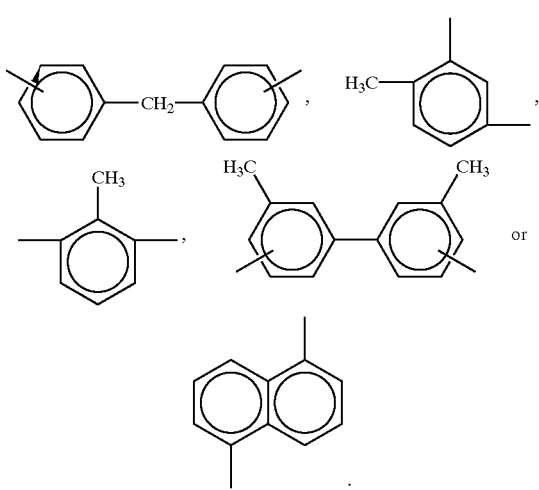

7. The adhesive sheet of claim 1 wherein the siloxane-modified polyamideimide resin is a resin produced by carrying out a reaction of a mixture (X) comprising a diamine (A) having three or more aromatic rings per molecule and a siloxanediamine (B) in a molar ratio (A)/(B) of 99.9/0.1 to 0.1/99.9 with trimellitic anhydride (C) in a molar ratio $\{(A)+(B)\}/(C)$ of 1/2.05 to 1/2.20, in the presence of an aprotic polar solvent, at 50 to 90° C., then at 120 to 180° C. after addition of 10 to 50% by weight, based on the aprotic polar solvent, of an aromatic hydrocarbon, which is azeotropic with water, to form a diimidodicarboxylic acid mixture (Y) containing an aromatic diimidodicarboxylic acid derived from the diamine (A) and a siloxanediimidodicarboxylic acid derived from the siloxanediamine (B), and allowing the diumidodicarboxylic acid mixture (Y) to react with an aromatic diusocyanate (D) of general formula (3), wherein general formula (3) is:

$$OCN-R_9-NCO \qquad (3)$$

wherein $R_9$ is

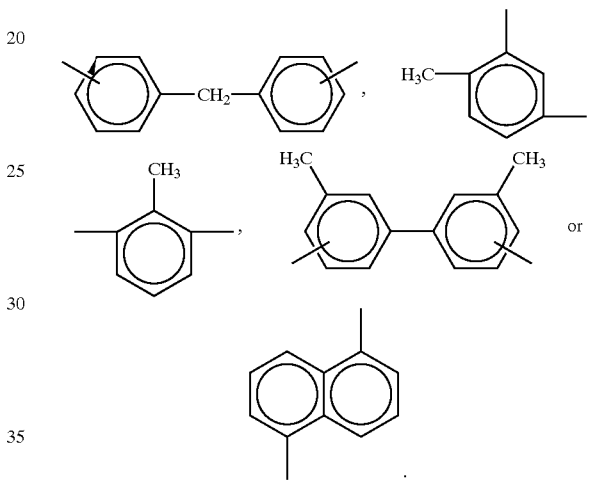

8. The adhesive sheet of claim 1 wherein the siloxane-modified polyamideimide resin is a resin produced by allowing a mixture (X) comprising a diamine (A) having three or more aromatic rings per molecule and a siloxanediamine (B) in a molar ratio (A)/(B) of 99.9/0.1 to 0.1/99.9 to react with trimellitic anhydride (C) in a molar ratio $\{(A)+(B)\}/(C)$ of 1/2.05 to 1/2.20 to form a diimidodicarboxylic acid mixture (Y) comprising an aromatic diimidodicarboxylic acid derived from the diamine (A) and a siloxanediimidodicarboxylic acid derived from the siloxane diamine (B), and allowing the diimidodicarboxylic acid mixture (Y) to react with an aromatic diisocyanate (D) in a molar ratio of $\{(A)+(B)\}/(D)$ of 1/1.05 to 1/1.50.

9. A chip-size package board produced by a method comprising the steps of:
  (1) making a through-hole in the adhesive sheet of claim 1, then
  (2) laminating a copper foil on the adhesive layer (a), and then
  (3) forming a circuit by removing unnecessary parts of the copper foil by etching.

* * * * *